United States Patent
Watanabe

(10) Patent No.: US 6,992,341 B2
(45) Date of Patent: Jan. 31, 2006

(54) AMPLIFYING SOLID-STATE IMAGE PICKUP DEVICE

(75) Inventor: Takashi Watanabe, Kyoto (JP)

(73) Assignee: Sharp Kabuishiki Kaisha, Osaka (JP)

(*) Notice: Subject to any disclaimer, the term of this patent is extended or adjusted under 35 U.S.C. 154(b) by 0 days.

(21) Appl. No.: 11/067,393

(22) Filed: Feb. 25, 2005

(65) Prior Publication Data

US 2005/0185073 A1 Aug. 25, 2005

(30) Foreign Application Priority Data

Feb. 25, 2004 (JP) .............................. P2004-049482

(51) Int. Cl.
*H01L 31/062* (2006.01)

(52) U.S. Cl. ............... 257/292; 257/183.1; 257/184; 257/238; 257/290; 257/291; 257/443

(58) Field of Classification Search ................ 257/443, 257/290, 291, 292, 183.1, 184, 238
See application file for complete search history.

(56) References Cited

U.S. PATENT DOCUMENTS

| 5,739,562 A | * | 4/1998 | Ackland et al. ............ 257/291 |
| 5,955,753 A | * | 9/1999 | Takahashi .................... 257/292 |
| 6,037,577 A | * | 3/2000 | Tanaka et al. ........... 250/208.1 |
| 6,836,291 B1 | * | 12/2004 | Nakamura et al. .......... 348/301 |
| 6,903,771 B2 | * | 6/2005 | Sakuragi ..................... 348/308 |

FOREIGN PATENT DOCUMENTS

JP 09-046596 2/1997

OTHER PUBLICATIONS

I. Inoue, et al., *New LV-BPD (Low Voltage Buried Photo-Diode) for CMOS Imager*, IEDM 99, pp. 883-886 (1999).

* cited by examiner

*Primary Examiner*—Christian D. Wilson
*Assistant Examiner*—Douglas M. Menz
(74) *Attorney, Agent, or Firm*—David G. Conlin; David A. Tucker; Edwards Angell Palmer & Dodge LLP

(57) ABSTRACT

There is provided an amplifying solid-state image pickup device capable of improving S/N and maintaining a charge-voltage conversion efficiency high. In the amplifying solid-state image pickup device, signal charges of a plurality of photodiodes 1 are added up on an input side of a switched capacitor amplification part 20 via the transfer transistors 2.

6 Claims, 12 Drawing Sheets

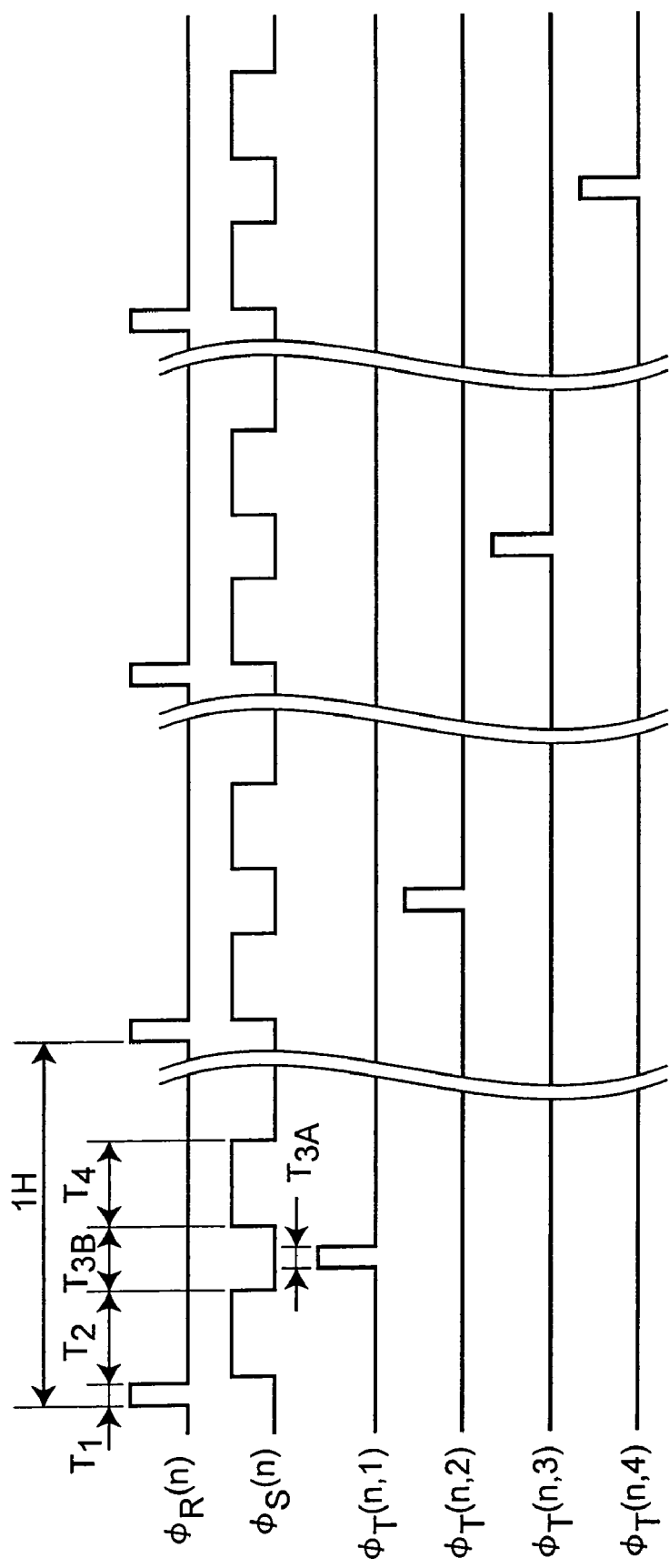

ODD-NUMBERED FIELD

EVEN-NUMBERED FIELD

AMPLIFYING SOLID-STATE IMAGE PICKUP DEVICE

This nonprovisional application claims priority under 35 U.S.C. §119(a) on Patent Application No. 2004-049482 filed in Japan on Feb. 25, 2004, the entire contents of which are hereby incorporated by reference.

BACKGROUND OF THE INVENTION

The present invention relates to an amplifying solid-state image pickup device.

Conventionally, there has been proposed an amplifying solid-state image pickup device which has a pixel section having an amplification function and a scanning circuit disposed around the pixel section, where pixel data is read from the pixel section by the scanning circuit. In particular, there has been known an APS (Active Pixel Sensor) type image sensor formed of CMOSs (Complementary Metal Oxide Semiconductor) which are advantageous for integration of the pixel part with peripheral drive circuit and signal processing circuit.

For the APS type image sensor, there is a need for forming a photoelectric conversion part, an amplification part, and a pixel select part and a reset part normally within one pixel. Therefore, in the APS type image sensor, normally, three to four MOS transistors (Tr) are used in addition to the photoelectric conversion part formed of photodiodes (PD).

FIG. 8 shows a construction of an APS type image sensor which employs one photodiode (PD) and four MOS transistors (Tr) to make up a PD+4Tr system. This PD+4Tr system APS image sensor is disclosed in, for example, Reference "I. Inoue et al., IEDM Tech. Digest, pp. 883–886 (1999)."

The APS type image sensor of the PD+4Tr system shown in FIG. 8 is made up of a photodiode 201 as a "PD" and, as the "4Tr," a transfer transistor 202 for transferring signal charge stored in the photodiode 201, a reset transistor 231, an amplification transistor 232 and a pixel select transistor 233. In this case, assuming that the photodiode 201 is given as buried type and signal charge transfer from the photodiode 201 is perfect, it is known that quite great noise reduction can be achieved and that high-quality images can be obtained.

A drive pulse for the transfer transistor 202 is represented by $\phi_T$, a drive pulse for the reset transistor 231 is represented by $\phi R_R$, and a drive pulse for the pixel select transistor 233 is represented by $\phi_S$. Also, a vertical signal line 235 is grounded via a constant-current load transistor 234 to which a drive pulse $\phi_L$ is applied, where an output signal $V_S$ is obtained. In addition, $V_{DD}$ represents a power supply voltage (constant voltage).

For the amplifying solid-state image pickup device, it is useful to obtain a high resolution by reading out all the pixels independently of one another in the still picture mode and to enhance a read frame speed or sensitivity despite sacrificing the resolution by performing addition among pixels in the moving picture mode.

However, in the case of the amplifying solid-state image pickup device shown in FIG. 8, there would arise a problem as follows. That is, because signal charge is converted and amplified into a voltage signal and then read out from pixel to pixel, the addition operation among pixels is one to be performed among the read voltage signals. This require analog or digital memory elements in addition to the pixel section for the purpose of the addition operation, resulting in a more complex read circuit construction. Further, this method is poor in the S/N (Signal-to-Noise ratio) improvement effect. The reason of this is as follows.

Here is examined an addition between two pixels P1 and P2. Signals at the pixels are assumed as s1 and s2, respectively, and noise generated at the photoelectric conversion part is assumed as np1 and np2, and noise generated at the in-pixel amplification part is assumed as na1 and na2. Since noise np1 and np2 and noise na1 and na2 are not mutually correlated but independent of each other, total noise n12 is as shown by the following equation (Eq. 1):

$$n12 = \sqrt{(np1^2 + np2^2 + na1^2 + na2^2)} \tag{Eq. 1}$$

A total signal s12 is as shown by the following equation (Eq. 2):

$$s12 = s1 + s2 \tag{Eq. 2}$$

Assuming a case where noise generated at the photoelectric conversion part is suppressed so that (np1, np2)<<(na1, na2) and where signals P1 and P2 are of the same and generated noise is also equivalent, $$s12 = 2 \cdot s1 \text{ and } n12 = \sqrt{2} \cdot na1,$$

$$s12/n12 = \sqrt{2} \cdot (s1/na1) \tag{Eq. 3}$$

so that the S/N is improved only to $\sqrt{2}$ times.

Here is examined a case where the addition operation between pixels is performed before the conversion to voltage and the amplification, and then a signal after the addition is read out.

In this case, the noise after the addition is represented by the following equation (Eq. 4), being smaller than that of (Eq. 1):

$$n12 = \sqrt{(np1^2 + np2^2 + na1^2)} \tag{Eq. 4}$$

On the other hand, since the signal is represented by (Eq. 2) through charge addition, a case is examined in which (np1, np2)<<(na1) and the signals P1 and P2 are of the same.

Since s12=2·s1 and n12=na1, $$s12/n12 = 2 \cdot (s1/na1) \tag{Eq. 5}$$

so that the S/N is improved to two times. An example of this operation is shown below.

FIG. 9 shows an amplifying solid-state image pickup device in which a signal charge storage part 208, a reset transistor 231, an amplification transistor 232 and a pixel select transistor 233 are provided in common to a plurality of photodiodes 201 and transfer transistors 202 (see, e.g., JP 09-46596 A).

In FIG. 9, the same symbols as those in FIG. 8 represent the same contents as those in FIG. 8. FIG. 9 differs from FIG. 8 in that one set of a charge detection part 208, a reset transistor 231, an amplification transistor 232 and a pixel select transistor are provided in common to upper-and-lower two pixels. As a result, turning ON simultaneously a drive pulse $\phi_T(m, 1)$ of a transfer transistor 202 of a pixel (m, 1) and a drive pulse $\phi_T(m, 2)$ of a transistor of a pixel (m, 2) makes it possible to read out added-up signal charge of photodiodes 201 of the upper-and-lower two pixels (m: natural number).

However, in the construction and operation of the amplifying solid-state image pickup devices shown in FIG. 9, there arise problems as shown below. That is, given that the capacity of the common signal charge storage part 208 is CFD, a charge-voltage conversion efficiency η at which signal charge Qsig derived from the photodiode 201 is converted to a voltage signal Vsig is $$\eta = GSF \cdot Vsig/Qsig = GSF/CFD \quad \text{(Eq. 6)}$$

where GSF is the gain of a source follower circuit made up of the amplification transistor 232 and the constant-current load transistor 234, being smaller than 1.

As apparent from Equation 6, the capacity CFD needs to be reduced in order to enlarge the charge-voltage conversion efficiency $\eta$. The capacity CFD of the common signal charge storage part 208 is a sum of a drain-side junction capacitance of the transfer transistor 202 and a gate capacitance of the amplification transistor 232, both transistors being connected to the signal charge storage part 208. Therefore, the drain junction capacitance of the transfer transistors and wiring capacitance increase according as the number of photodiodes and transfer transistors connected to a common signal charge storage part increases, which leads to a problem that the charge-voltage conversion efficiency $\eta$ decreases.

SUMMARY OF THE INVENTION

The present invention, intended to solve this problem, has an object of providing an amplifying solid-state image pickup device which performs an addition of signal charges in pixels, making it possible to achieve the addition operation without burdening the read circuit, and which is capable of not only enhancing the S/N improvement effect by addition but also keeping the charge-voltage conversion efficiency even with the addition structure.

In order to achieve the above object, according to the present invention, there is provided an amplifying solid-state image pickup device comprising:

a plurality of photoelectric conversion transfer parts which are provided for individual pixels, respectively, and each of which has a photoelectric conversion element and at least one transfer transistor for transferring signal charge of the photoelectric conversion element, wherein the plurality of photoelectric conversion transfer parts are divided into a plurality of photoelectric conversion transfer part groups each composed of at least two of the photoelectric conversion transfer parts, respectively;

a plurality of switched capacitor amplification parts which are provided for the individual photoelectric conversion transfer part groups, respectively, of which input side of each is connected to an output side of each transfer transistor of the photoelectric conversion transfer parts and of which output side of each is connected to a signal line; and a control part for selecting a plurality of photoelectric conversion transfer parts out of all the photoelectric conversion transfer parts within the photoelectric conversion transfer part group, and controlling the transfer transistors and the switched capacitor amplification parts so that signal charges of the photoelectric conversion elements of the selected plurality of photoelectric conversion transfer parts are transferred to the input side of the switched capacitor amplification part via the transfer transistors of the selected plurality of photoelectric conversion transfer parts, the plurality of signal charges are added up, and the added-up signal charge is read out by the switched capacitor amplification parts.

In this amplifying solid-state image pickup device of this invention, the signal charges of the plurality of photoelectric conversion elements are added up on the input side of the switched capacitor amplification part via the transfer transistors. This means an addition by electric charge, producing a large effect for S/N improvement. Also, the addition operation is performed at the pixel part, so that the read circuit never becomes complex. It becomes possible to effectively reduce the capacity of the signal charge storage part on the input side of the switched capacitor amplification parts by constituting amplifiers with the switched capacitor amplification parts, so that the charge-voltage conversion gain can be enhanced. Also, since a plurality of photoelectric conversion transfer parts are selected out of all the photoelectric conversion transfer parts in the photoelectric conversion transfer part group and then the signal charges of the photoelectric conversion elements of the selected photoelectric conversion transfer parts are added up, it becomes possible to select the combination of pixels (photoelectric conversion elements) in various ways, making the device applicable over a wide range.

In one embodiment, the control part is switchable between an addition operation mode for performing addition of the signal charges and an independent operation mode for independently reading signal charges of the photoelectric conversion elements, respectively, without performing the addition of signal charges.

In this embodiment, only changing the driving method of the control part makes it possible to select from between the independent operation mode that involves no addition operation so that a high resolution is ensured, and the addition operation mode that involves addition operation so that high frame read speed and sensitivity improvement are ensured whereas the resolution is sacrificed.

In one embodiment, the photoelectric conversion element is a buried photodiode.

In one embodiment, each of the photoelectric conversion elements has any one of a plurality of color characteristics, and the signal charges of the photoelectric conversion elements are added up which have an identical color characteristic.

In this embodiment, the amplifying solid-state image pickup device serves as a color solid-state image pickup device, in which pixel addition is enabled even with color elements and, in particular, enhancing the signal quantity of identical colors in primary-color based color elements allows the sensitivity to be increased.

In one embodiment, each of the photoelectric conversion elements has any one of a plurality of color characteristics, and the signal charges of the photoelectric conversion elements are added up which have different color characteristics composing a combination of a specified plurality of colors, respectively.

In this embodiment, the amplifying solid-state image pickup device serves as a color solid-state image pickup device, in which pixel addition is enabled even with color elements and, in particular, enhancing necessary color signals by addition of a particular combination of colors especially in complementary-color based color elements allows the sensitivity to be increased.

In one embodiment, the photoelectric conversion transfer part groups are arrayed in a matrix shape, in each of the photoelectric conversion transfer parts, the transfer transistors are composed of an odd-numbered field transfer transistor and an even-numbered field transfer transistor which respectively transfer signal charge of the photoelectric conversion element, the switched capacitor amplification part includes an odd-numbered field switched capacitor amplification part whose input side is connected to an output side of the odd-numbered field transfer transistor and an even-numbered field switched capacitor amplification part whose input side is connected to an output side of the even-numbered field transfer transistor, the control part includes an odd-numbered field control part for controlling the odd-numbered field transfer transistor and the odd-numbered field switched capacitor amplification part as well as an even-numbered field control part for controlling the even-numbered field transfer transistor and the even-numbered field switched capacitor amplification part, and the odd-numbered field control part and the even-numbered field control part perform interlace reading of a columnar-direction combination of photoelectric conversion elements to be added to the odd-numbered field switched capacitor amplification part side as well as a columnar-direction combination of photoelectric conversion elements to be added to the even-numbered field switched capacitor amplification part side each with a shift of one row in the columnar direction.

In this embodiment, the combination of pixels to be added up on the field basis is shifted by one horizontal row (i.e., shifted by one row in the columnar direction) so as to implement interlace reading. Therefore, it becomes possible to do interlace reading, which has been difficult to do particularly with color elements.

According to the amplifying solid-state image pickup device of the present invention, the signal charges of the plurality of photoelectric conversion elements are added up on the input side of the switched capacitor amplification parts via the transfer transistors, the S/N improvement effective becomes larger. Also, the addition operation is performed at the pixel part, so that the read circuit never becomes complex. Further, with the amplification circuit provided as the switched capacitor type, it becomes possible to effectively reduce the capacity of the signal charge storage part on the input side of the switched capacitor amplification parts, so that the charge-voltage conversion gain can be enhanced. Also, only changing the driving method makes it possible to select from between an operation mode that involves no addition operation so that a high resolution is ensured, and an operation mode that involves addition operation so that high frame read speed and sensitivity improvement are ensured whereas the resolution is sacrificed.

Thus, the present invention is greatly useful for the formation of image sensors that are capable of switching between still pictures of high resolution and motion pictures of high sensitivity and high speed.

BRIEF DESCRIPTION OF THE DRAWINGS

The present invention will become more fully understood from the detailed description given hereinbelow and the accompanying drawings which are given by way of illustration only, and thus are not intended to limit the present invention, and wherein:

FIG. 2C is a timing chart of drive pulses in the two-dimensional amplifying solid-state image pickup device shown in FIG. 1C;

DETAILED DESCRIPTION OF THE PREFERRED EMBODIMENTS

Hereinbelow, the present invention is described in more detail by reference to an embodiment shown in the accompanying drawings.

First Embodiment

Figure 1A:
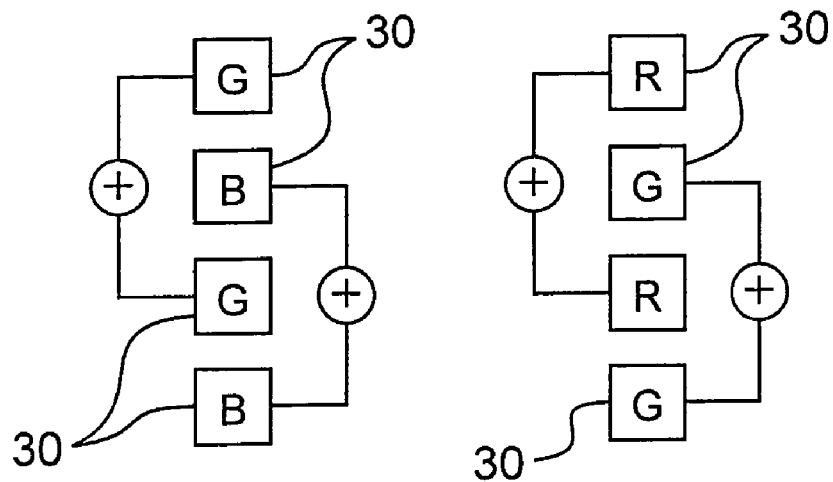
FIG. 1A is an operation explanatory view of a two-dimensional amplifying solid-state image pickup device according to an embodiment of the invention.
Figure 1B:
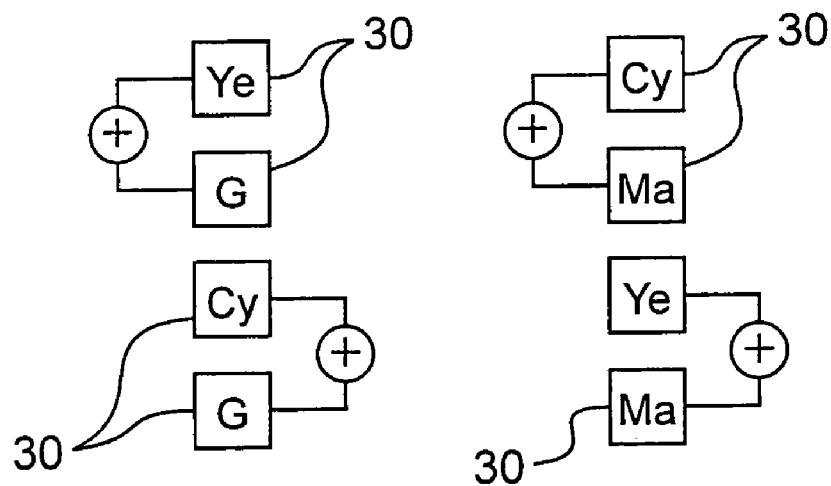
FIG. 1B is an operation explanatory view of a two-dimensional amplifying solid-state image pickup device according to an embodiment of the invention.
Figure 1C:
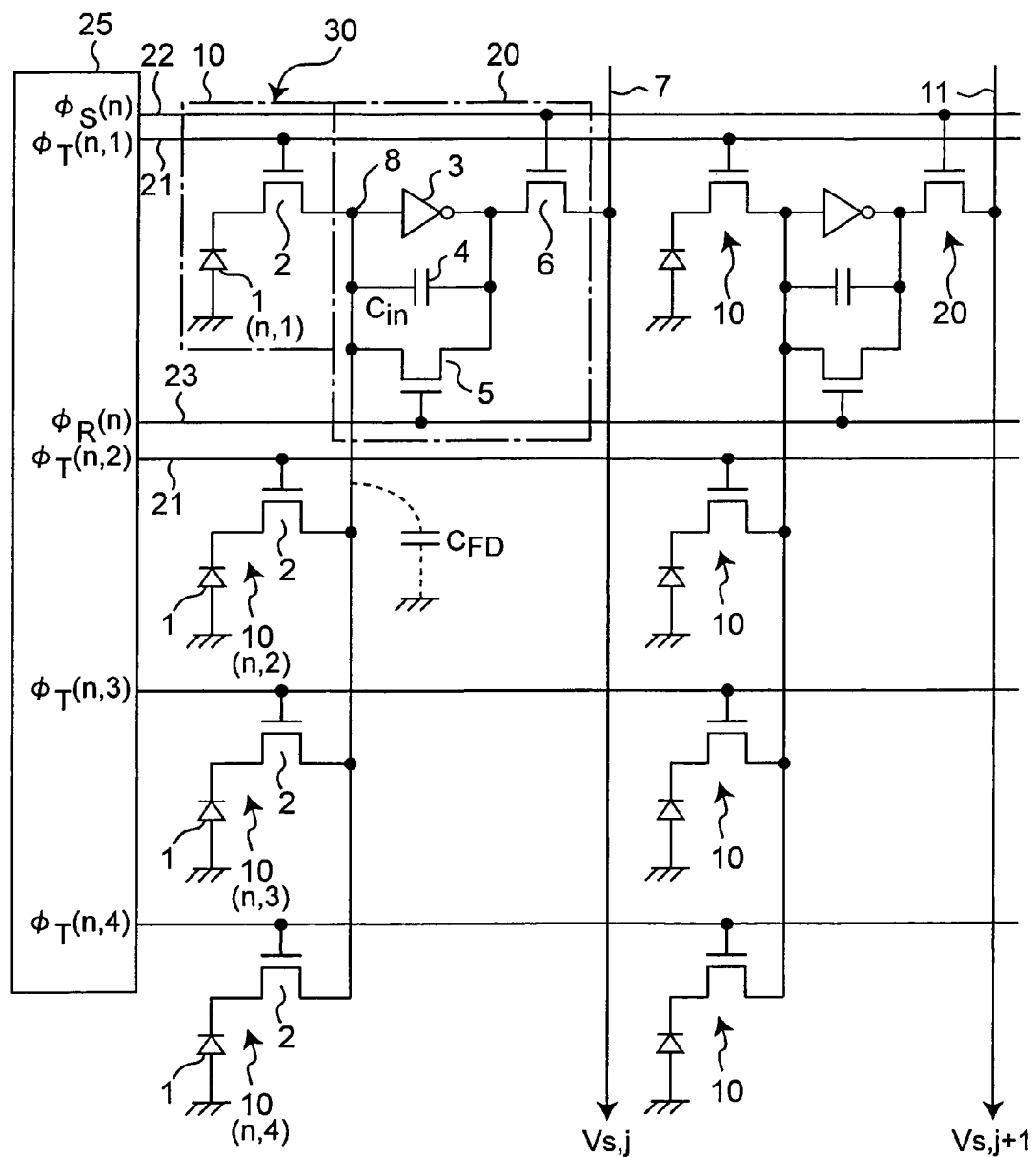
FIG. 1C is a circuit diagram of a two-dimensional amplifying solid-state image pickup device according to an embodiment of the invention.

FIGS. 1A to 1C show a two-dimensional amplifying solid-state image pickup device as an example of an amplifying solid-state image pickup device, which is an embodiment of the present invention. FIG. 1A is an explanatory view showing an example of pixel addition, FIG. 1B is an explanatory view showing another example of pixel addition, and FIG. 1C is a circuit diagram of the two-dimensional amplifying solid-state image pickup device.

FIG. 1A shows an example of a method for performing an addition between upper-and-lower two pixels 30, 30 of an identical color in a Bayer pattern color filter that is composed of the three primary colors, green (G), red (R) and blue (B), where the addition operation is performed every other pixel.

FIG. 1B shows an example of a method for performing an addition between upper-and-lower two pixels 30, 30 of a specific color combination in a color filter that is composed of complementary colors of yellow (Ye), cyan (Cy) and magenta (Ma), and green (G), where the following addition results can be obtained alternately in a cycle of 1H (one horizontal scanning period):

[Ye+G, Cy+Ma]-th row→brightness+color-difference
signal (2B-G)

[Cy+G, Ye+Ma]-th row→brightness+color-difference
signal (2R-G).

Thus, a necessary color signal can be obtained.

As shown in FIG. 1C, a circuit for fulfilling the pixel addition shown in FIGS. 1A and 1B includes a photoelectric conversion transfer part 10 provided in every pixel 30, a switched capacitor amplification part 20 for converting signal charge derived from the photoelectric conversion transfer part 10 into voltage to amplify the voltage, and a vertical scanning circuit 25 as an example of a control part for controlling the photoelectric conversion transfer part 10 and the switched capacitor amplification part 20.

FIG. 1C show only two columns, the j-th (j is a natural number) column and the (j+1)-th column, out of the photoelectric conversion transfer parts 10 of a plurality of rows and a plurality of columns, where switched capacitor amplification parts 20 are respectively connected to photoelectric conversion transfer part groups. The photoelectric conversion transfer part groups are respectively constituted by photoelectric conversion transfer parts 10 in each column. It is noted that k is an integer of not less than 2, and an example of k=4 is shown in FIG. 1C.

The photoelectric conversion transfer part 10 has a photodiode 1 as an example of a photoelectric conversion element whose anode is connected to the ground, and a transfer transistor 2 whose drain is connected to a cathode of the photodiode 1.

Also, the switched capacitor amplification part 20 has an inverting amplifier 3, a reset transistor 5 and a capacitor 4 (as an example of a capacitance element), both being inserted between input and output of the inverting amplifier 3, and a select transistor 6 inserted between the output side of the inverting amplifier 3 and a vertical signal line 7.

On the input side of the inverting amplifier 3 is a signal charge storage part 8 to which four photoelectric conversion transfer parts 10 are commonly connected at their output side (i.e., source of the transfer transistors 2). That is, the signal charge storage part 8 extends from an input end of the switched capacitor amplification part 20 up to the output side of each transfer transistor 2. It is noted that a capacitance of the signal charge storage part 8 is expressed by CFD, and a capacitance of the capacitor 4 is by $C_{in}$.

The vertical scanning circuit 25 has transfer transistor drive signal lines 21, a select transistor drive signal line 22, and a reset transistor drive signal line 23.

The transfer transistor drive signal line 21 is connected to a gate of the transfer transistor 2 of each of the photoelectric conversion transfer parts 10 arrayed along the row direction. The select transistor drive signal line 22 is connected to a gate of the select transistor 6 of the switched capacitor amplifier part 20. The reset transistor drive signal line 23 is connected to a gate of the reset transistor 5 of the switched capacitor amplifier part 20.

Referring to FIG. 1C, a pixel of the first row connected to the n-th switched capacitor amplifier part 20 is expressed by (n, 1) where n is a natural number, and a pixel of the second row is by (n, 2), . . . , a pixel of the fourth row is by (n, 4). Drive pulses $\phi_T(n, 1)$, $\phi_T(n, 2)$, . . . , $\phi_T(n, 4)$ outputted from the vertical scanning circuit 25 are applied to the gate of the transfer transistor 2 of each of the pixel(n, 1), pixel(n, 2), . . . , pixel(n, 4) via each of transfer transistor drive signal lines 21.

A drive pulse $\phi_R(n)$ is applied to the gate of the reset transistor 5 of the n-th switched capacitor amplifier part 20 via the reset transistor drive signal line 23, and a drive pulse $\phi_s(n)$ is applied to the gate of the select transistor 6 via the select transistor drive signal line 22.

Then, an output signal $V_{s,j}$ is obtained from an output signal line 7 of the j-th column, and an output signal $V_{s,j+1}$ is obtained from output signal line 11 of the (j+1)th column.

It is noted that the gain $G_{AM}$ of the inverting amplifier 3 is set as large a value as possible. With the gain $G_{AM}$ large enough, the inverting amplifier 3, the reset transistor 5 and the capacitor 4 make up a switched capacitor amplifier in FIG. 1C. Accordingly, the signal charge of the signal charge storage part 8 is transferred to the capacitor 4 (capacitance $C_{in}$) and stored therein. That is, the capacitance for conversion of signal charge into voltage effectively changes from CFD to $C_{in}$, where a setting that CFD>>$C_{in}$ makes it possible to increase the charge-voltage conversion efficiency.

Further, in FIG. 1C, assuming that the photodiode 1 is of the buried type and that the charge transfer from the photodiode 1 to the signal charge storage part 8 via the transfer transistor 2 is perfect, noise generated at the photoelectric conversion transfer part 10 can be suppressed to a large extent.

Figure 2A:
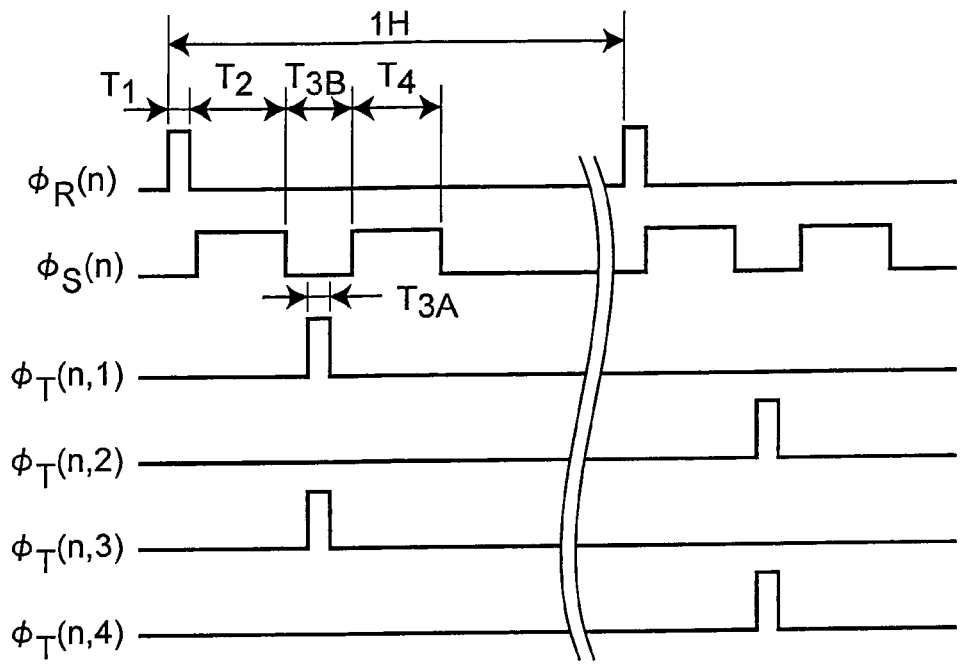
FIG. 2A is a timing chart of drive pulses in the two-dimensional amplifying solid-state image pickup device corresponding to FIG. 1A and shown in FIG. 1C.
Figure 2B:
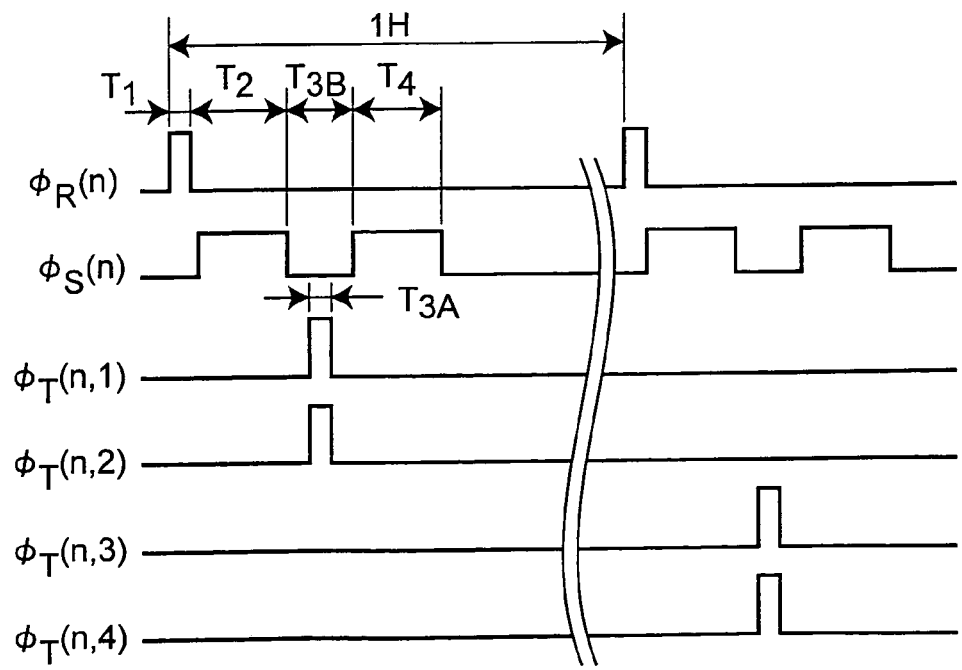
FIG. 2B is a timing chart of drive pulses in the two-dimensional amplifying solid-state image pickup device corresponding to FIG. 1B and shown in FIG. 1C.

FIGS. 2A–2C are timing charts for explaining operations of the two-dimensional amplifying solid-state image pickup device shown in FIGS. 1A–1C, where FIG. 2A corresponds to FIG. 1A, FIG. 2B corresponds to FIG. 1B, and FIG. 2C shows timing in the case where pixel addition is not performed. It is in a period $T_{3A}$ that the pixel addition operation is performed, and FIGS. 2A–2C differ from one another only in the operation in each period $T_{3A}$.

In a period $T_1$, in common to FIGS. 2A–2C, a drive pulse $\phi_R(n)$ applied to the reset transistor 5 of the n-th switched capacitor amplification part 20 goes High level, causing the reset transistor 5 to turn to an On state. As a result, input and output of the inverting amplifier 3 are short-circuited, where the voltage of the signal charge storage part 8 is reset to a constant voltage.

In the next period $T_2$, in common to FIGS. 2A–2C, the drive pulse $\phi_R(n)$ goes Low level, causing the reset transistor 5 to turn to an Off state. However, because the drive pulse $\phi_s(n)$ is at High level, the select transistor 6 turns to the On state. Also, the inverting amplifier 3 inverts and amplifies the voltage of the signal charge storage part 8, and the reset level is read to the vertical signal line 7 via the select transistor 6.

In the next period $T_{3B}$, the drive pulse $\phi_s(n)$ goes Low level, causing the select transistor 6 to turn Off.

In the case shown in FIG. 2A, in the period $T_{3A}$ of the first 1H (one horizontal scanning period), the drive pulse $\phi_T(n,1)$ applied to the pixel (n, 1) and the drive pulse $\phi_T(n, 3)$ applied to the pixel (n, 3) go High level, so that the potential levels of the gates of the transfer transistors 2 rise. Resultantly, the signal charges stored in the photodiodes 1 of the pixels (n, 1) and (n, 3) are transferred to the signal charge storage part 8. That is, pixel signal charges of the pixels (n, 1) and (n, 3) are added up. In the next 1H, since the drive pulse $\phi_T(n, 2)$ applied to the pixel (n, 2) and the drive pulse $\phi_T(n, 4)$ applied to the pixel (n, 4) go High level, so that the potential levels of the gates of transfer transistors 2 rise. Resultantly, the signal charges stored in the photodiodes 1 of the pixels (n, 2) and (n, 4) are transferred to the signal charge storage part 8. That is, pixel signal charges of the pixels (n, 2) and (n, 4) are added up. Thus, the operation shown in FIG. 2A corresponds to that of FIG. 1A.

In the case shown in FIG. 2B, in the period $T_{3A}$ of the first 1H, the drive pulse $\phi_T(n, 1)$ applied to the pixel (n, 1) and the drive pulse $\phi_T(n, 2)$ applied to the pixel (n, 2) go High level, so that the potential levels of the gates of the transfer transistors 2 rise. Resultantly, the signal charges stored in the photodiodes 1 of the pixels (n, 1) and (n, 2) are transferred to the signal charge storage part 8. That is, pixel signal charges of the pixels (n, 1) and (n, 2) are added up. In the next 1H, since the drive pulse $\phi_T(n, 3)$ applied to the pixel (n, 3) and the drive pulse $\phi_T(n, 4)$ applied to the pixel (n, 4) go High level, so that the potential levels of the gates of the transfer transistors 2 rise. Resultantly, the signal charges stored in the photodiodes 1 of the pixels (n, 3) and (n, 4) are transferred to the signal charge storage part 8. That is, pixel signal charges of the pixels (n, 3) and (n, 4) are added up. Thus, the operation shown in FIG. 2B corresponds to that of FIG. 1B.

In the case shown in FIG. 2C, in the operation in the period $T_{3A}$, since the drive pulse $\phi_T(n, i)$ applied to the pixel (n, i) goes High level so that the potential level of the gate of the transfer transistor 2 rises, signal charge stored in the photodiodes 1 of the pixel (n, i) is transferred to the signal charge storage part 8. That is, pixel signal charge of the pixel (n, i) is read out solely. In this case, because i is shifted from 1 to 4 successively by 1H, the pixels (n, 1) to (n, 4) are read out successively and independently.

In the next period $T_4$, in common to FIGS. 2A–2C, the drive pulse $\phi_T(n, 1)$ goes Low level, causing the transfer transistor 2 to turn to an Off state. Therefore, the signal charge storage part 8 holds a voltage that is shifted from the voltage in the period $T_2$ by a variation due to the signal charge transfer, and the drive pulse $\phi_S(n)$ is at High level so that the select transistor 6 turns to an On state. Therefore, the signal level is amplified by the inverting amplifier 3, and read to the vertical signal line 7 via the select transistor 6.

In the above addition operation for pixel signals, since signal charges are added up on the input side of the switched capacitor amplification part 20, noise resulting after the addition is represented by the mentioned equation (Eq. 4), being smaller as compared with that of the mentioned equation (Eq. 1).

In the addition operation of the present invention, a signal is represented by the above (Eq. 2) through charge addition. Therefore, assuming that (np1, np2)<<(na1) and that signals of P1 and P2 are of the same, the S/N is as shown by the above (Eq. 5) from the relations that s12=2·s1 and n12=na1, where the improvement of S/N enlarges to a double.

Further, in the present invention, with the gain $G_{AM}$ of the inverting amplifier 3 large enough as described above, there is a great advantage that the input capacitance $C_{FD}$ of the switched capacitor amplification part 20 can be neglected, allowing the charge-voltage conversion efficiency to be increased despite the pixel charge addition structure.

In FIGS. 2A and 2B, a case has been shown in which the addition period $T_{3A}$ for addition of two pixel signal charges is concurrent between two rows. However, the present invention not being limited to this, the periods $T_{3A}$ and $T_{3A}$ may not coincide each other between two rows if the periods $T_{3A}$ and $T_{3A}$ are within the period $T_{3B}$. That is, even with a time difference in read operation, a correct addition is achieved.

Second Embodiment

Figure 3:
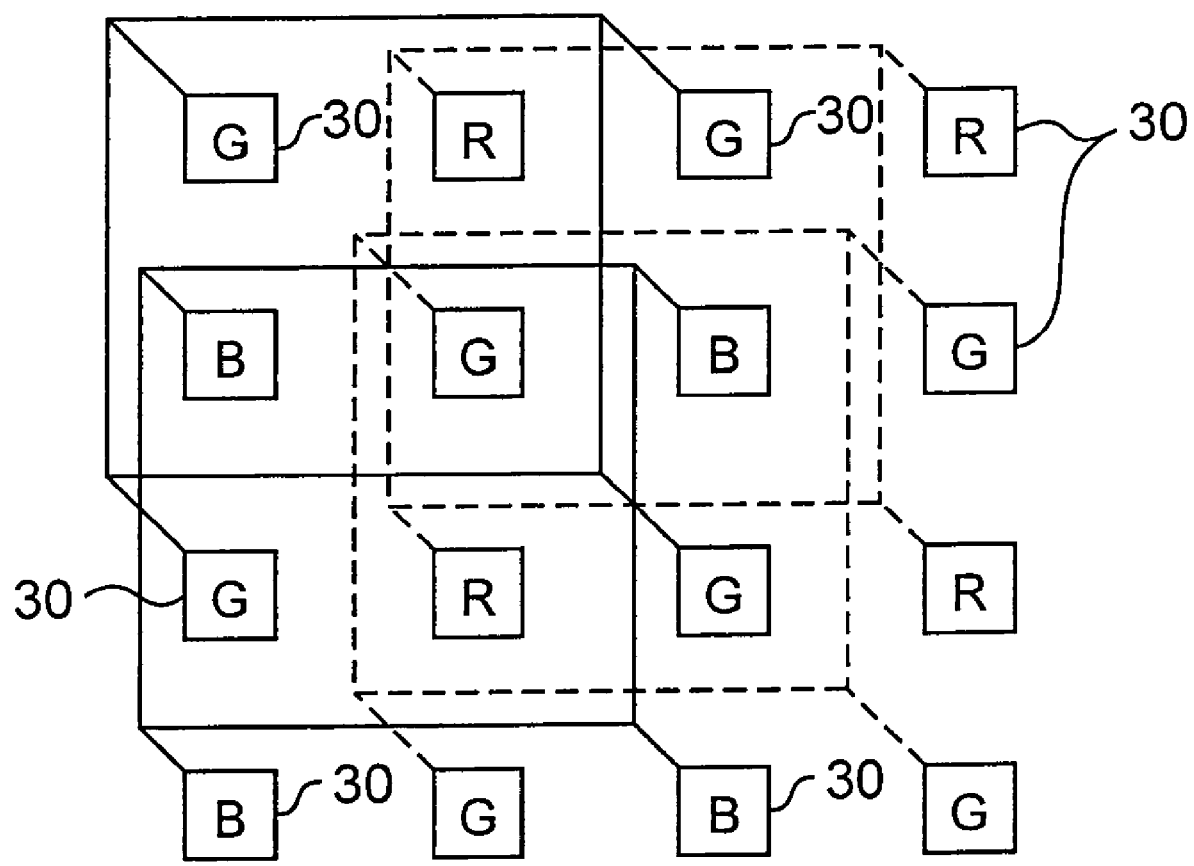
FIG. 3 is an operation explanatory view of a two-dimensional amplifying solid-state image pickup device according to another embodiment of the invention.
Figure 4:
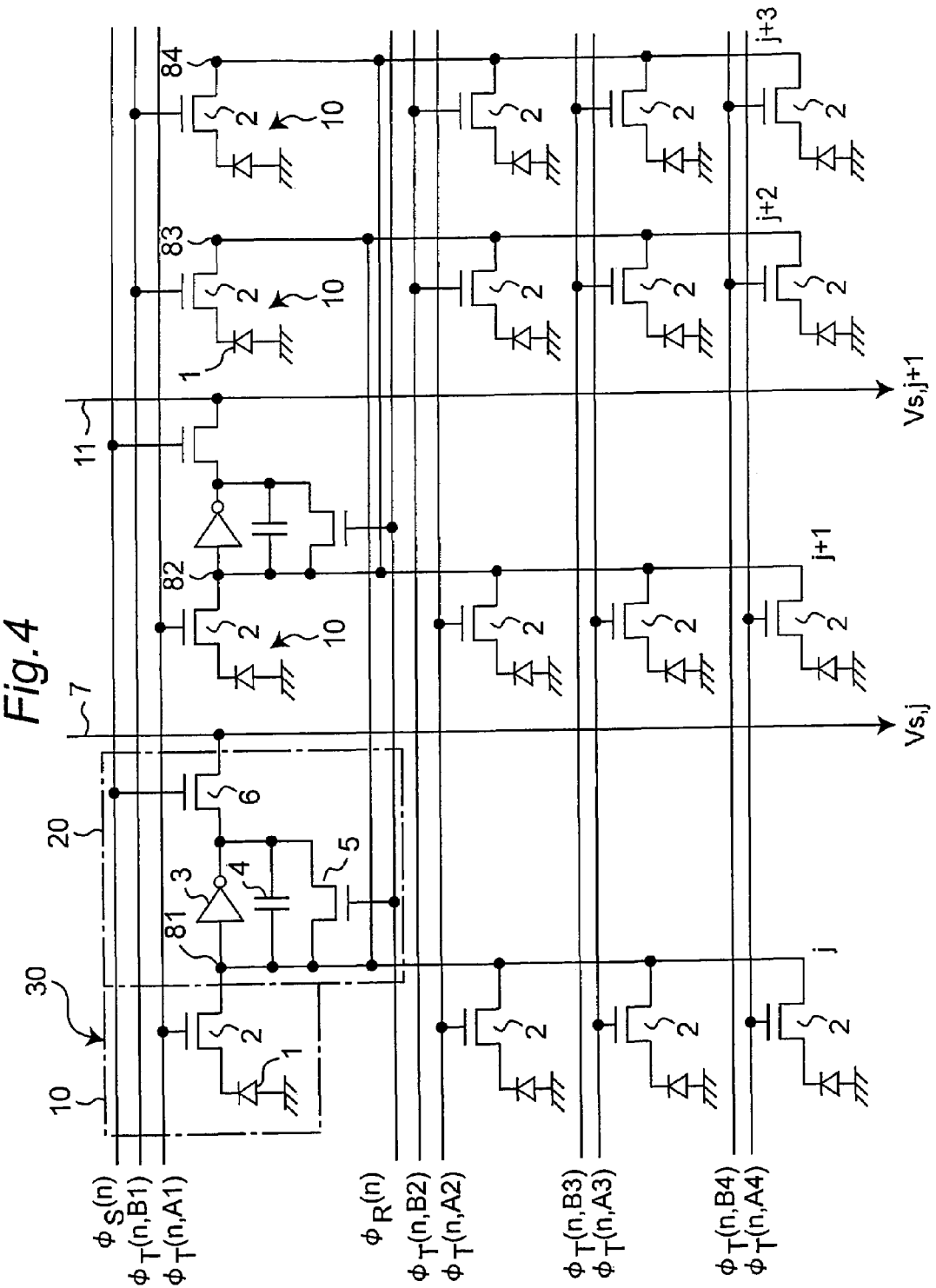
FIG. 4 is a circuit diagram in the two-dimensional amplifying solid-state image pickup device shown in FIG. 3.

FIG. 3 shows an example of pixel addition in a two-dimensional amplifying solid-state image pickup device as an example of an amplifying solid-state image pickup device, which is another embodiment of the invention. FIG. 4 shows a circuit diagram for fulfilling the pixel addition shown in FIG. 3, and FIGS. 5A and 5B shows timing charts for explaining operations of the circuit shown in FIG. 4.

FIG. 3 shows an example of a method for performing an addition among upper-and-lower two pixels 30, 30 and left-and-right two pixels 30, 30 of an identical color in a Bayer pattern color filter that is composed of the three primary colors, green (G), red (R) and blue (B), where the addition operation is performed every other pixel in both horizontal and vertical directions.

FIG. 4, in which symbols common to FIG. 1C represent like contents, differs from FIG. 1C in that a first signal charge storage part 81 of the j-th column and a third signal charge storage part 83 of the (j+2)th column are connected to each other while a second signal charge storage part 82 of the (j+1)th column and a fourth signal charge storage part 84 of the (j+3)th column are connected to each other, and that the transfer transistors 2 of the first and second columns in groups of four columns are connected to a horizontal transfer transistor drive signal line $\phi_T(n, Ai)$ while the transfer transistors 2 of the third and fourth columns in groups of four columns are connected to a horizontal transfer transistor drive signal line $\phi_T(n, Bi)$, where i and n are natural numbers.

Figure 5A:
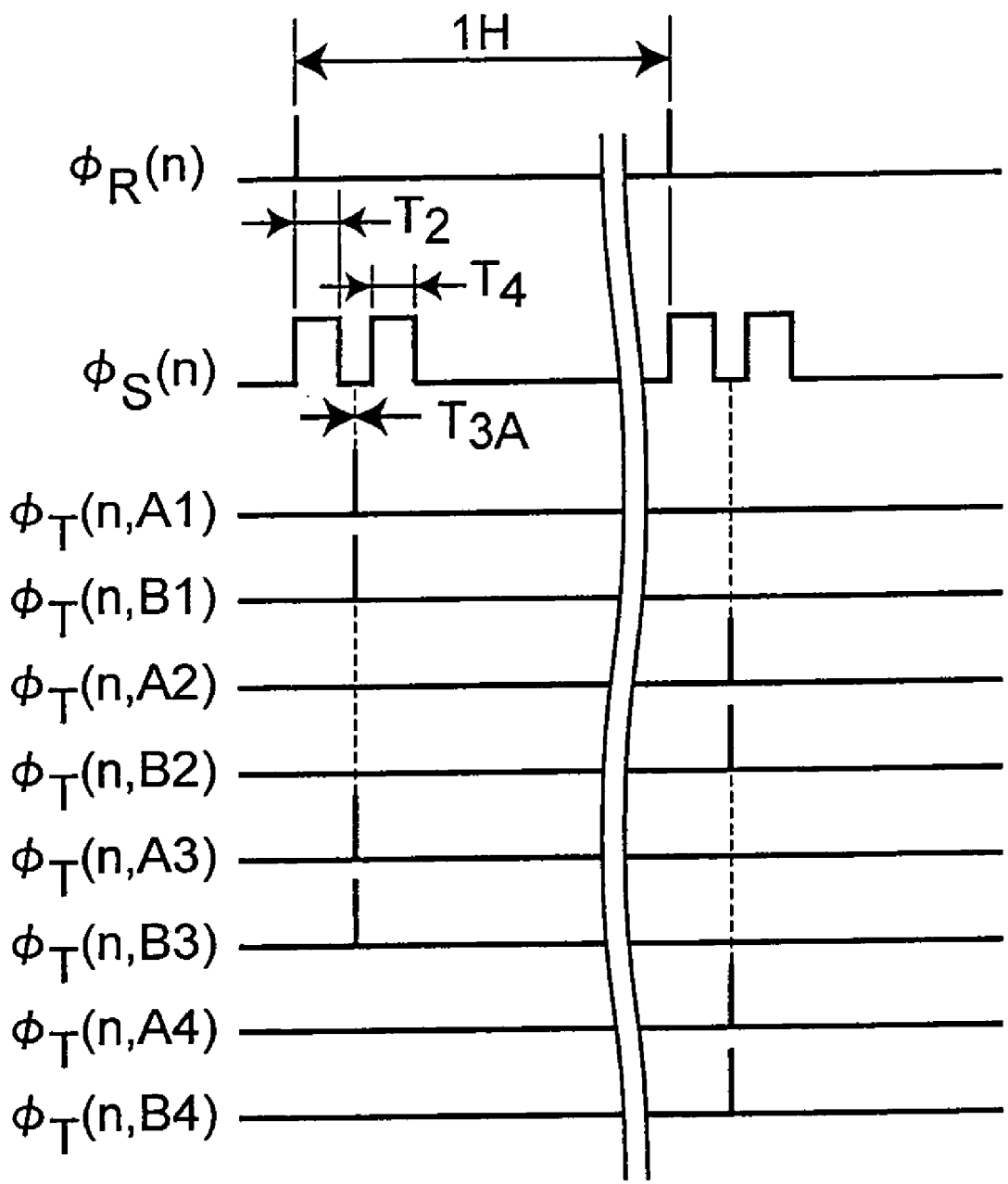
FIG. 5A is a timing chart of drive pulses in the two-dimensional amplifying solid-state image pickup device corresponding to FIG. 3 and shown in FIG. 4.
Figure 5B:
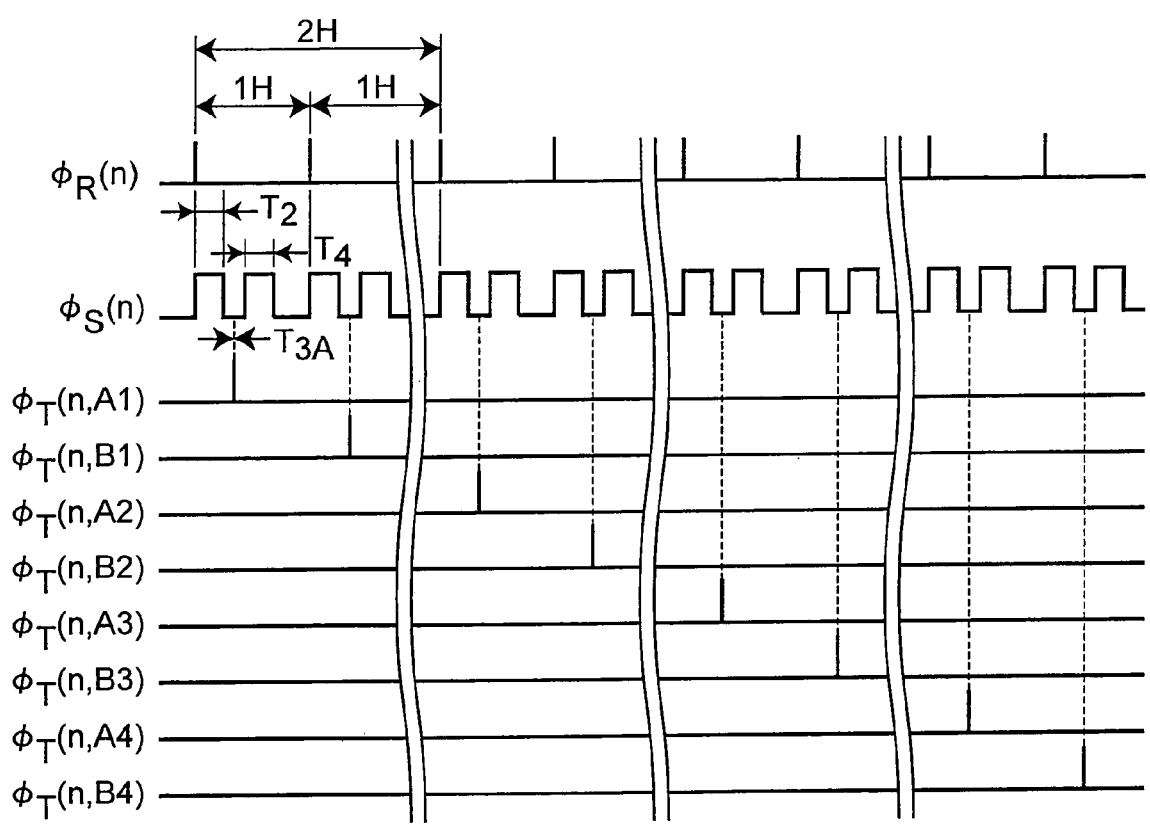
FIG. 5B is a timing chart of drive pulses in the two-dimensional amplifying solid-state image pickup device shown in FIG. 4.

In FIGS. 5A and 5B, the same symbols as in FIG. 2A represent the same contents.

FIG. 5A shows an operational timing chart of operation shown in FIG. 3. Referring to FIG. 5A, in the period $T_{3A}$ of the first 1H, drive pulses $\phi_T(n, A1)$ and $\phi_T(n, B1)$ as well as $\phi_T(n, A3)$ and $\phi_T(n, B3)$ on the transfer transistor drive signal lines from a vertical scanning circuit (not shown) turn ON simultaneously, and totally four pixels, i.e. pixel signals of the 1st column and the 3rd column of the 1st row as well as pixel signals of the 1st column and the 3rd column of the 3rd row, are added up and led to the signal line 7 of the j-th column, while totally four pixels, i.e. pixel signals of the 2nd column and the 4th column of the 1st row as well as pixel signals of the 2nd column and the 4th column of the 3rd row, are added up and led to the signal line 11 of the (j+1)th column.

In the period $T_{3A}$ of the next 1H, drive pulses $\phi_T(n, A2)$ and $\phi_T(n, B2)$ as well as $\phi_T(n, A4)$ and $\phi_T(n, B4)$ turn ON simultaneously, and totally four pixels, i.e. pixel signals of the 1st column and the 3rd column of the 2nd row as well as pixel signals of the 1st column and the 3rd column of the 4th row, are added up and led to the signal line 7 of the j-th column, while totally four pixels, i.e. pixel signals of the 2nd column and the 4th column of the 2nd row as well as pixel signals of the 2nd column and the 4th column of the 4th row, are added up and led to the signal line 11 of the (j+1)th column.

Referring to FIG. 5B, in the operation in the period $T_{3A}$, since drive pulses $\phi_T(n, Ai)$ and $\phi_T(n, Bi)$ applied to the pixels on the i-th row in groups of n rows go High level with a shift of a 1H (one horizontal scanning period) so that the potential levels of the gates of the transfer transistors 2 rise, signal charges stored in the photodiodes 1 of the pixels of the i-th row are transferred to the first and third signal charge storage parts 81, 83 with a shift of a 1H period and are transferred to the second and fourth signal charge storage parts 82, 84 with a shift of a 1H period. That is, pixel signals of the first column and third column in groups of four columns at the i-th row in groups of n rows are respectively led to the signal line 7 of the j-th column with a shift of a 1H period, and pixel signals of the second column and fourth column in groups of four columns at the i-th row in groups of n rows are respectively led to the signal line 11 of the (j+1)th column with a shift of a 1H period. In this case, because i is shifted from 1 through 4 successively on the 2H basis, all the pixels of the first through the fourth rows in groups of n rows are read out successively and independently on the 1H basis.

Third Embodiment

Figure 6A:
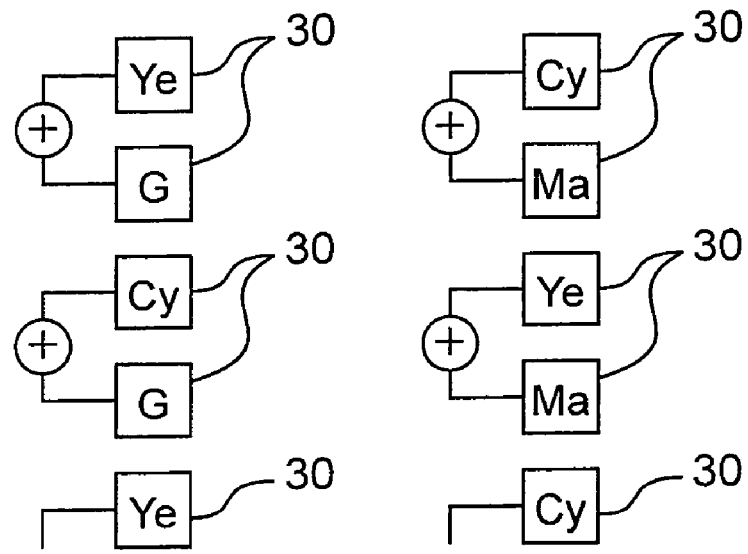
FIG. 6A is an operation explanatory view of an odd-numbered field in a two-dimensional amplifying solid-state image pickup device according to yet another embodiment of the invention.
Figure 6B:
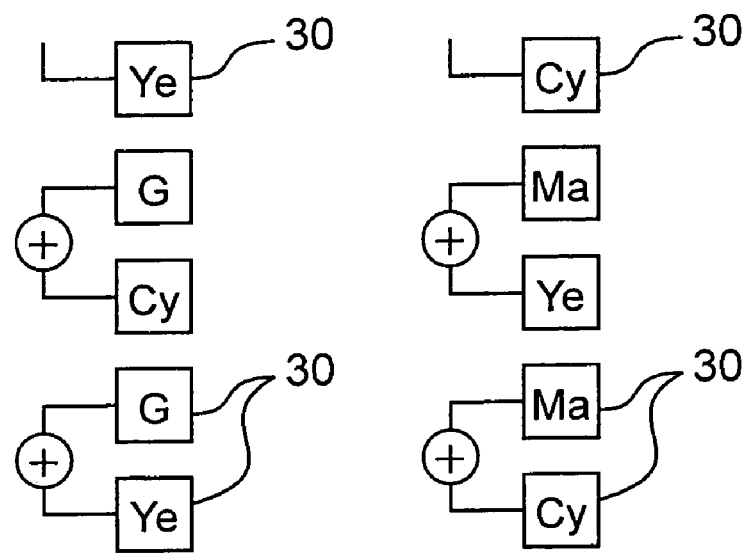
FIG. 6B is an operation explanatory view of an even-numbered field in a two-dimensional amplifying solid-state image pickup device according to still another embodiment of the invention.
Figure 7:
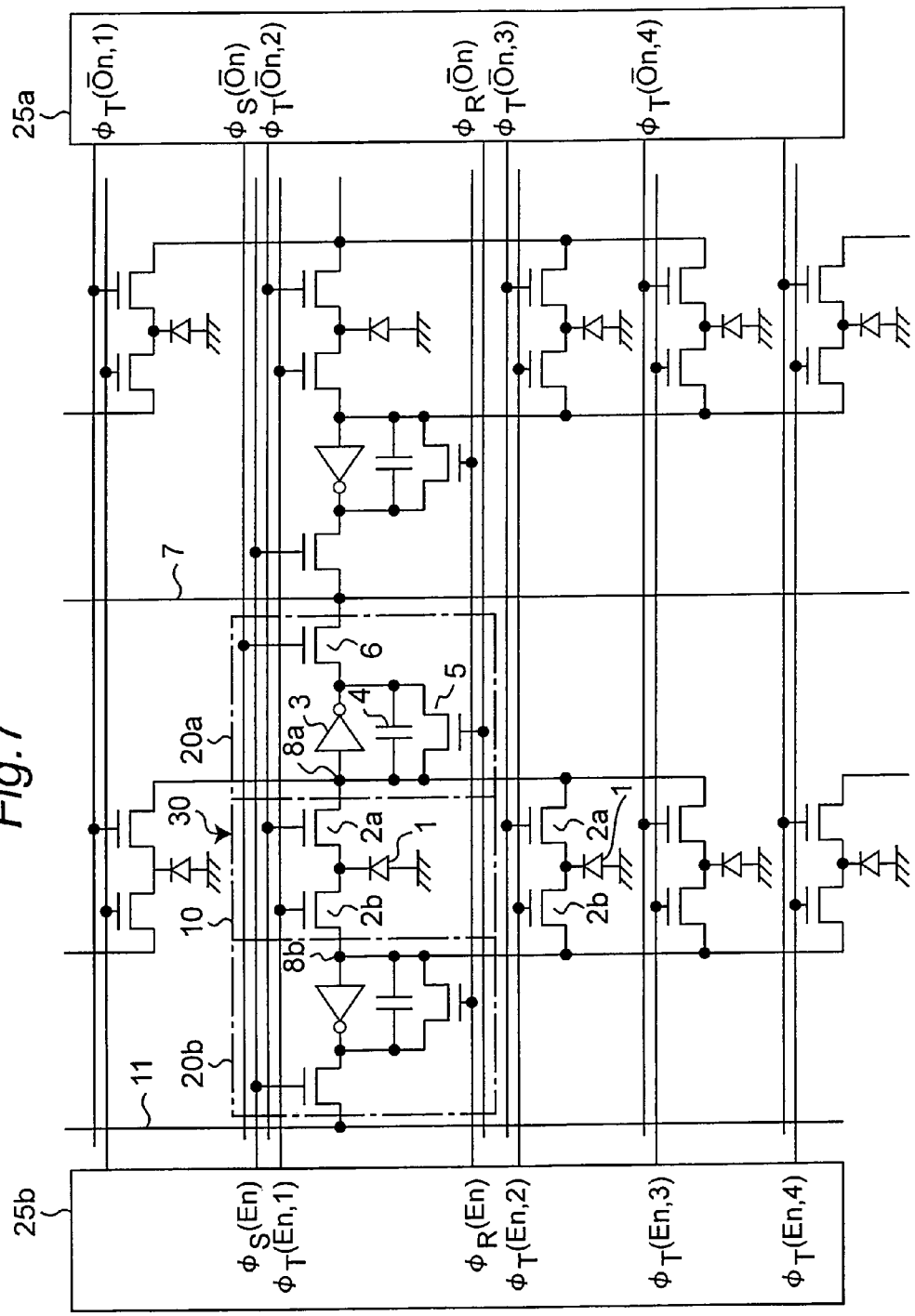
FIG. 7 is a circuit diagram of the two-dimensional amplifying solid-state image pickup device shown in FIGS. 6A and 6B.
Figure 8:
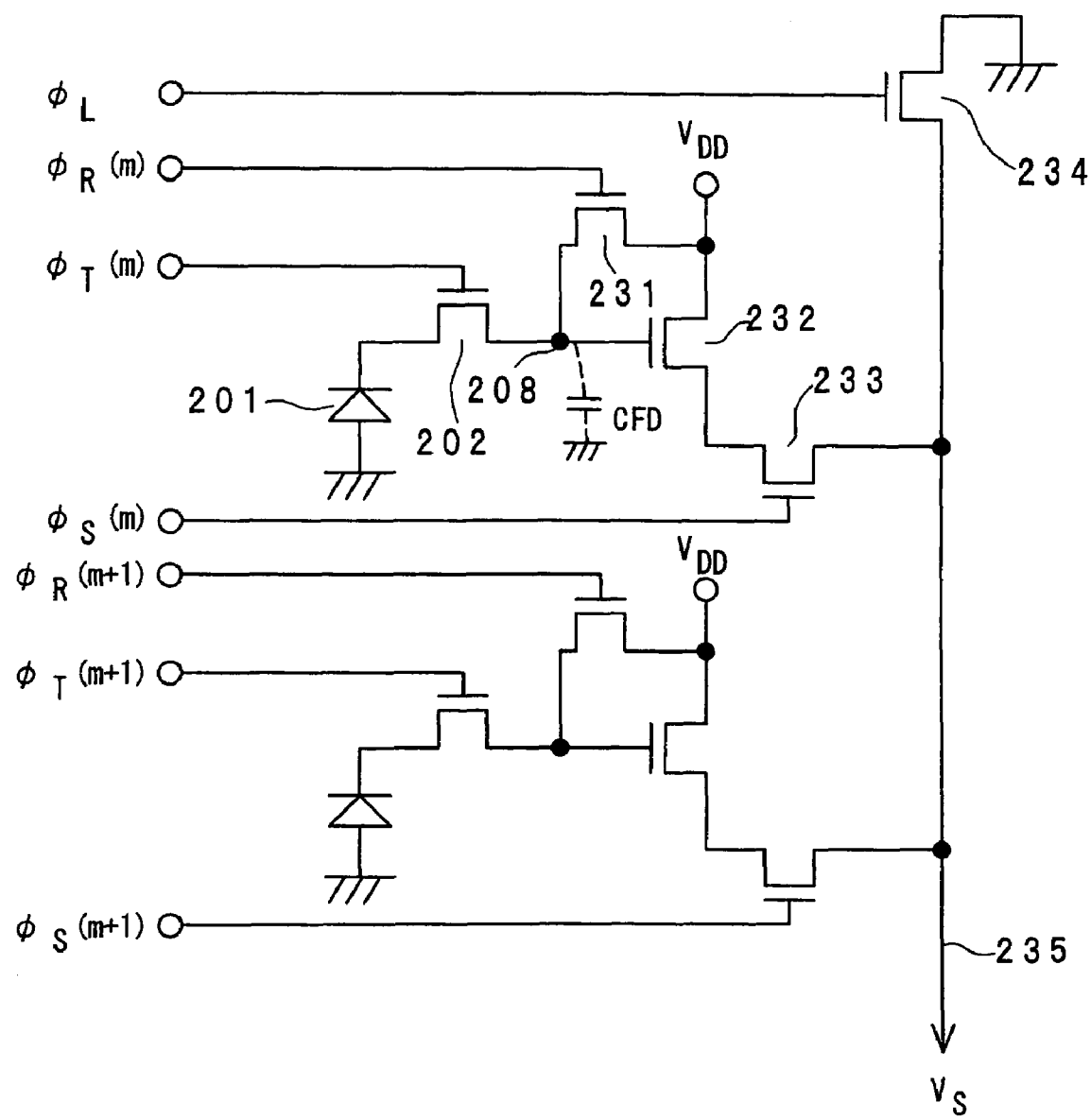
FIG. 8 is a circuit diagram of a plurality of pixels in an amplifying solid-state image pickup device according to a prior art.
Figure 9:
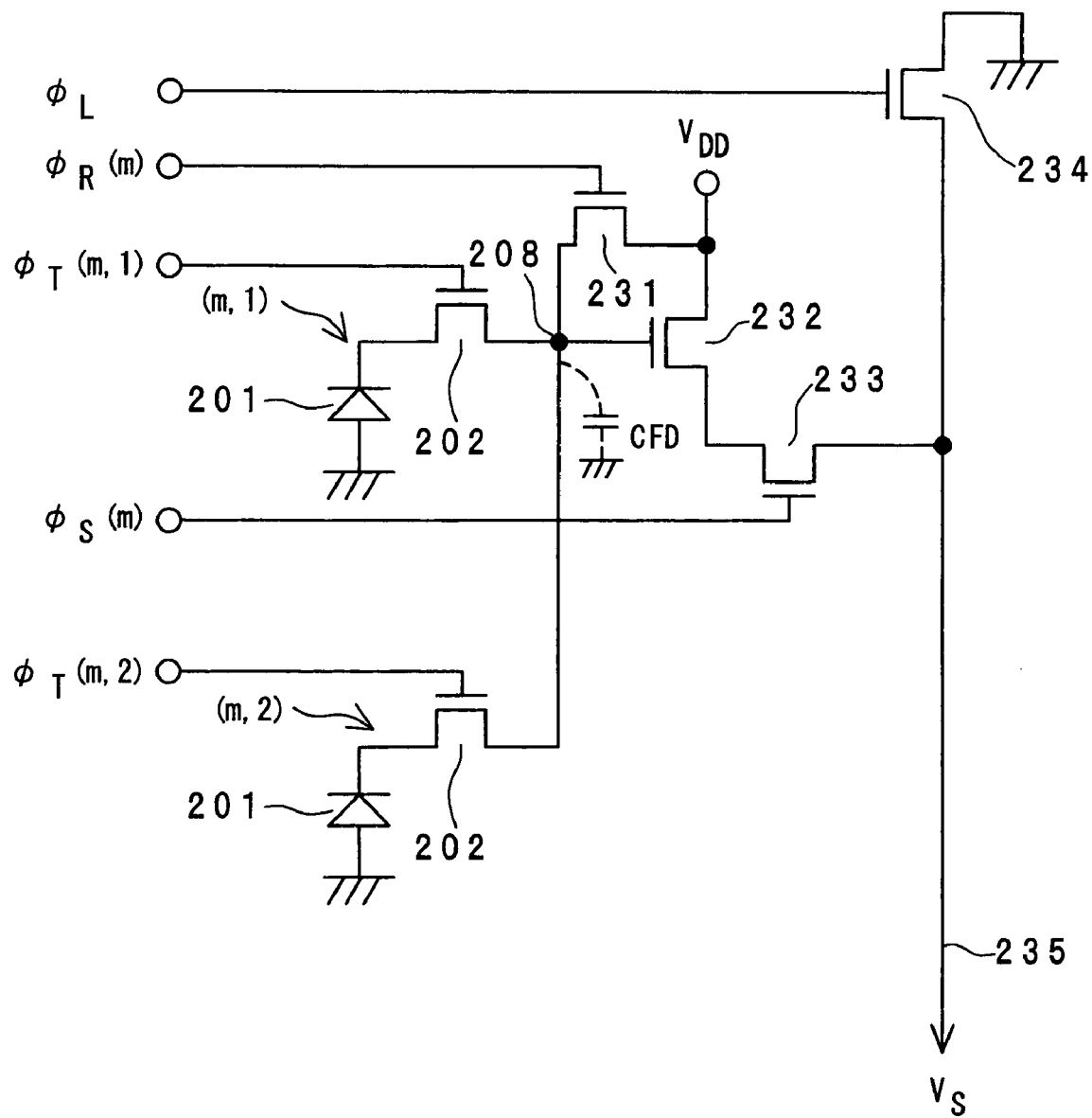
FIG. 9 is a circuit diagram of a plurality of pixels in another amplifying solid-state image pickup device according to a prior art.

FIGS. 6A and 6B show an example of the pixel addition of a two-dimensional amplifying solid-state image pickup device as an example of an amplifying solid-state image pickup device, which is yet another embodiment of the present invention. Also, FIG. 7 shows a circuit diagram for performing the pixel addition shown in FIGS. 6A and 6B.

FIGS. 6A and 6B, like FIG. 1B, show an example of the method for performing an addition between upper-and-lower two pixels 30, 30 of a specific color combination in a color filter that is composed of the complementary colors of yellow (Ye), cyan (Cy) and magenta (Ma), and green (G), where the following addition results can be obtained alternately in a cycle of 1H:

[Ye+G, Cy+Ma]-th row→brightness+color-difference signal (2B-G)

[Cy+G, Ye+Ma]-th row→brightness+color-difference signal (2R-G).

The difference from FIG. 1B lies in that the combination of pixels 30 to be added up is shifted by one horizontal row on the field basis, thereby enabling the interlaced reading. That is, in the odd-numbered field shown in FIG. 6A, the above signal is obtained by the addition between an odd-numbered row and an even-numbered row. In the even-numbered field shown in FIG. 6B, the above signal is obtained by the addition between an even-numbered row and an odd-numbered row.

FIG. 7, in which symbols common to FIG. 1C represent like contents, differs from FIG. 1C in that transfer transistors for transferring charge from photodiodes 1 include an odd-numbered field transfer transistor 2a and an even-numbered field transfer transistor 2b, where the odd-numbered field transfer transistor 2a is connected to an odd-numbered field signal charge storage part 8a while the even-numbered field transfer transistor 2b is connected to an even-numbered field signal charge storage part 8b, and where the odd-numbered field signal charge storage part 8a is connected to an odd-numbered field switched capacitor amplification part 20a while the even-numbered field signal charge storage part 8b is connected to an even-numbered field switched capacitor amplification part 20b.

In the odd-numbered field, drive pulses are applied from an odd-numbered field drive system (odd-numbered field vertical scanning circuit) 25a to the gates of the odd-numbered field transfer transistors 2a and the odd-numbered field switched capacitor amplification parts 20a. That is, a drive pulse $\phi_T(On, i)$ is applied to a gate of the transfer transistor 2a of the i-th row, a drive pulse $\phi_R(On)$ is applied to a gate of a reset transistor 5, and a drive pulse $\phi_S(On)$ is applied to a gate of the select transistor 6.

Similarly, in the even-numbered field, drive pulses are applied from an even-numbered field drive system (even-numbered field vertical scanning circuit) 25b to the even-numbered field transfer transistors 2b and the even-numbered field switched capacitor amplification parts 20b. That is, a drive pulse $\phi_T(En, i)$ is applied to a gate of the transfer transistor 2a of the i-th row, a drive pulse $\phi_R(En)$ is applied to a gate of the reset transistor 5, and a drive pulse $\phi_S(En)$ is applied to a gate of the select transistor 6.

Consequently, in comparison between the odd-numbered field and the even-numbered field, the combination of the photodiodes 1 (in the column direction) to be connected to the switched capacitor amplification parts 20a, 20b are shifted from each other by 1 horizontal row (i.e., shifted by one in the column direction). Therefore, in comparison between one case where drive pulses are applied from the odd-numbered field drive system 25a and another case where the drive pulses are applied from the even-numbered field drive system 25b, the combination of pixels to be added up is shifted by 1 horizontal row. That is, the interlaced reading is enabled. Thus, it becomes implementable to perform interlaced reading, which has been difficult for color elements of the APS image sensor.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An amplifying solid-state image pickup device comprising:
    a plurality of photoelectric conversion transfer parts which are provided for individual pixels, respectively, and each of which has a photoelectric conversion element and at least one transfer transistor for transferring signal charge of the photoelectric conversion element, wherein
    the plurality of photoelectric conversion transfer parts are divided into a plurality of photoelectric conversion transfer part groups each composed of at least two of the photoelectric conversion transfer parts, respectively;
    a plurality of switched capacitor amplification parts which are provided for the individual photoelectric conversion transfer part groups, respectively, of which input side of each is connected to an output side of each transfer transistor of the photoelectric conversion transfer parts and of which output side of each is connected to a signal line; and
    a control part for selecting a plurality of photoelectric conversion transfer parts out of all the photoelectric conversion transfer parts within the photoelectric conversion transfer part group, and controlling the transfer transistors and the switched capacitor amplification parts so that signal charges of the photoelectric conversion elements of the selected plurality of photoelectric conversion transfer parts are transferred to the input side of the switched capacitor amplification part via the transfer transistors of the selected plurality of photoelectric conversion transfer parts, the plurality of signal charges are added up, and the added-up signal charge is read out by the switched capacitor amplification parts.

2. The amplifying solid-state image pickup device as claimed in claim 1, wherein
    the control part is switchable between an addition operation mode for performing addition of the signal charges and an independent operation mode for independently reading signal charges of the photoelectric conversion elements, respectively, without performing the addition of signal charges.

3. The amplifying solid-state image pickup device as claimed in claim 1, wherein
    the photoelectric conversion element is a buried photodiode.

4. The amplifying solid-state image pickup device as claimed in claim 1, wherein
    each of the photoelectric conversion elements has any one of a plurality of color characteristics, and the signal charges of the photoelectric conversion elements are added up which have an identical color characteristic.

5. The amplifying solid-state image pickup device as claimed in claim 1, wherein
each of the photoelectric conversion elements has any one of a plurality of color characteristics, and
the signal charges of the photoelectric conversion elements are added up which have different color characteristics composing a combination of a specified plurality of colors, respectively.

6. The amplifying solid-state image pickup device as claimed in claim 1, wherein
the photoelectric conversion transfer part groups are arrayed in a matrix shape,
in each of the photoelectric conversion transfer parts, the transfer transistors are composed of an odd-numbered field transfer transistor and an even-numbered field transfer transistor which respectively transfer signal charge of the photoelectric conversion element,
the switched capacitor amplification part includes an odd-numbered field switched capacitor amplification part whose input side is connected to an output side of the odd-numbered field transfer transistor and an even-numbered field switched capacitor amplification part whose input side is connected to an output side of the even-numbered field transfer transistor,
the control part includes an odd-numbered field control part for controlling the odd-numbered field transfer transistor and the odd-numbered field switched capacitor amplification part as well as an even-numbered field control part for controlling the even-numbered field transfer transistor and the even-numbered field switched capacitor amplification part, and
the odd-numbered field control part and the even-numbered field control part perform interlace reading of a columnar-direction combination of photoelectric conversion elements to be added to the odd-numbered field switched capacitor amplification part side as well as a columnar-direction combination of photoelectric conversion elements to be added to the even-numbered field switched capacitor amplification part side each with a shift of one row in the columnar direction.

* * * * *

UNITED STATES PATENT AND TRADEMARK OFFICE
CERTIFICATE OF CORRECTION

PATENT NO. : 6,992,341 B2
APPLICATION NO. : 11/067393
DATED : January 31, 2006
INVENTOR(S) : Takashi Watanabe It is certified that error appears in the above-identified patent and that said Letters Patent is hereby corrected as shown below:

On the cover page of the patent, at Column 1, Item (73) in the section designated "ASSIGNEE" change "Sharp Kabuishiki Kaisha" to
--Sharp Kabushiki Kaisha--

Signed and Sealed this

Twenty-fifth Day of July, 2006

JON W. DUDAS
*Director of the United States Patent and Trademark Office*